Feb. 22, 1966 R. L. WATTERS 3,237,123

ELECTROMECHANICAL OSCILLATOR APPARATUS

Filed Aug. 8, 1961

Inventor:
Robert L. Watters,
by Joseph V. Claeys
His Attorney.

United States Patent Office 3,237,123

Patented Feb. 22, 1966

3,237,123
ELECTROMECHANICAL OSCILLATOR APPARATUS

Robert L. Watters, Schenectady, N.Y., assignor to General Electric Company, a corporation of New York Filed Aug. 8, 1961, Ser. No. 130,043
5 Claims. (Cl. 331—107)

Figure 1:
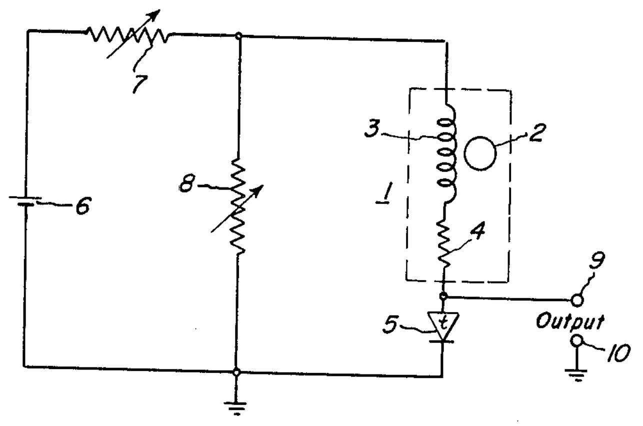

This invention relates to electromechanical oscillator apparatus and in particular to such oscillators utilizing semiconductor devices.

In the operation of many electrical systems there is need for a stable source of low frequency oscillations. Feed-back type oscillators are known in the art and have been utilized to produce low frequency oscillations. With the advent of the semiconductor transistor device such oscillator circuits have been greatly improved and reduced in size. Such feed-back type oscillators, however, require relatively complex circuitry and have been found to lack the necessary stability for a great many applications as, for example, in selective frequency systems and accurate time bases. This invention deals with a new and novel low frequency electromechanical oscillator having greater stability and reliability than previous low frequency oscillators and which provides a further advance in circuit simplicity and reduction in size.

The semiconductor device utilized in the practice of this invention is of the type well-known in the art as a "Tunnel Diode device." Such devices are two terminal devices which comprise a very narrow space charge region such that the current at low voltages is determined essentially by the quantum mechanical tunneling process. A semiconductor tunnel diode device, wherein the semiconductive material on either side of the P-N junction has been rendered degenerate at room temperature, usually exhibits a region of negative resistance in the low forward voltage range of its current-voltage characteristic. For purposes of this invention the tunnel diode device utilized should exhibit such a negative resistance characteristic.

The forward voltage range wherein the negative resistance region appears in such a tunnel diode device varies depending upon the semiconductive material from which the device is fabricated. For example, the range of the negative resistance region is from about 0.04 to 0.3 volt for a germanium device, about 0.08 to 0.4 volt for a silicon device and about 0.15 to 0.6 volt for a gallium arsenide device.

Further details on tunnel diode devices such as utilized in the practice of this invention may be had by reference to the booklet entitled "Tunnel Diodes" published in November 1959 by Research Information Services, General Electric Company, Schenectady, N.Y.

It is an object of this invention to provide an oscillator for low frequencies which substantially overcome one or more of the disadvantages of the prior art arrangements and which has extreme stability.

It is another object of this invention to provide an electromechanical oscillator for producing stable low frequency oscillations which achieves circuit simplicity and savings in circuit components.

It is another object of this invention to provide an electromechanical oscillator which requires extremely low power input and provides an advance in circuit miniaturization.

It is still another object of this invention to provide a simplified and inexpensive source of extremely stable low frequency oscillations.

Briefly stated, in accordance with one aspect of this invention, an electromechanical oscillator comprises a tunnel diode device exhibiting a negative resistance region in the low forward voltage range of its current-voltage characteristic and an electromechanical frequency determining element in circuit therewith. The frequency determining element includes an oscillating member and an exciting winding therefor. The tunnel diode device is appropriately biased and coupled to the exciting winding of the frequency determining element causing oscillations to be produced and a stable output developed across the tunnel diode device having a repetition rate substantially determined by the natural mechanical frequency of the oscillating member.

Figure 2:
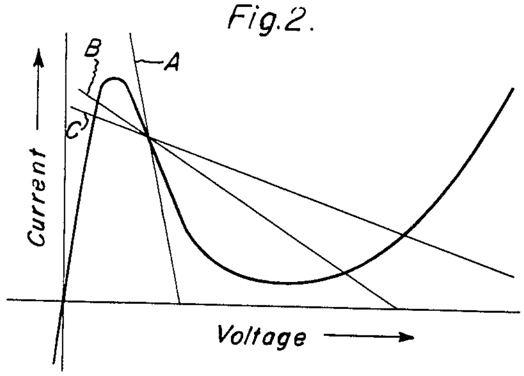
Figure 3:
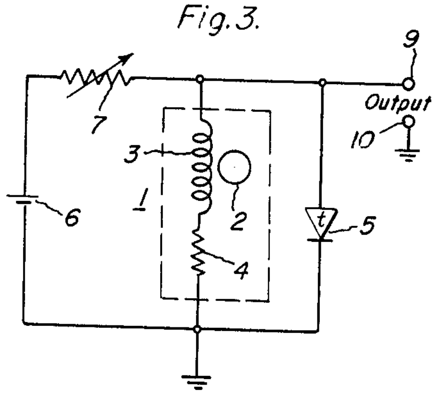
Figure 4:
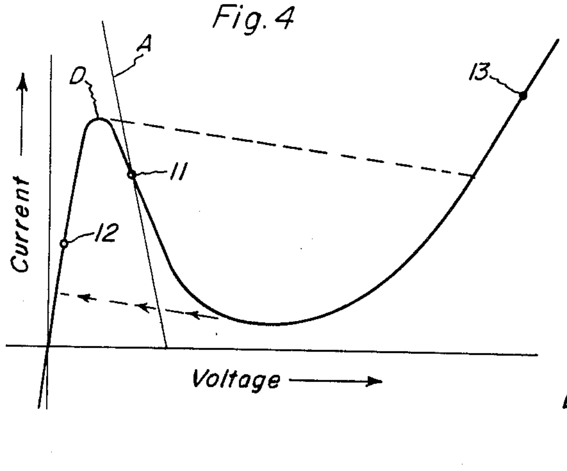

The novel features of my invention which I believe characteristic are set forth with particularity in the appended claims. My invention itself, however, both as to its organization and method of operation, together with further objects and advantages thereof, may best be understood by reference to the following description taken in connection with the accompanying drawing in which:

FIG. 1 is a schematic diagram of an electromechanical oscillator of this invention, FIG. 2 is a typical current-voltage characteristic of the semiconductor device suitable for use in the practice of this invention illustrating some suitable direct current load lines therefor, FIG. 3 is a schematic circuit diagram of another embodiment of the electromechanical oscillator of this invention; and FIG. 4 is a typical current-voltage characteristic of the semiconductor device suitable for use in the practice of this invention showing the operating path or "limit cycle" for a particular bias condition.

In FIG. 1 there is shown a schematic circuit diagram of one embodiment of an electromechanical oscillator of this invention. The circuit of FIG. 1 includes an electromechanical frequency determining element illustrated schematically at 1 comprising a mechanically oscillating member 2 and an exciting winding 3 therefor. Resistance 4 represents the resistance associated with winding 3 and has a value depending upon the characteristics thereof, as is well-known.

The circuit shown in FIG. 1 comprises a resistance 7, winding 3 with associated resistance 4 and tunnel diode device 5 all connected in series circuit with a voltage source 6. A resistance 8 is connected across the series connected tunnel diode device 5 and winding 3. The values of voltage source 6 and resistances 7 and 8 are so chosen, with respect to the tunnel diode device utilized and the value of the resistance 4 associated with winding 3, that a direct current load line is established which preferably intersects the tunnel diode current-voltage characteristic only in the negative resistance region thereof as shown by the line A in FIG. 2. Alternatively, these values may be so chosen that a direct current load line is established which intersects two positive resistance regions of the current-voltage characteristic thereby providing two stable operating conditions such as illustrated by the lines B and C respectively in FIG. 2.

The circuit shown in FIG. 3 represents another embodiment of this invention wherein the associated winding resistance 4 has a value sufficient to provide, in combination with voltage source 6 and resistance 7, a suitable direct current load line similar to those illustrated by either lines A, B or C in FIG. 2. When the resistance 4 associated with winding 3, therefore, has a value sufficient to provide the necessary shunt resistance for tunnel diode device 5 to establish a suitable load line, the circuit configuration shown in FIG. 3 may be employed wherein the tunnel diode device 5 is in parallel circuit relationship with winding 3 and its associated resistance 4 rather than in series circuit therewith as in the arrangement shown in FIG. 1. Depending upon the properties of the frequency determining element employed in any particular circuit, the series or parallel relationship may be indicated as being the more advantageous. The tunnel diode device therefore, may be coupled either in series or in parallel circuit relationship with the exciting winding of the frequency determining element. Such parameters as the value of the voltage source employed and the absolute value of the tunnel diode negative resistance are important in determining the value of shunt resistance to be used to establish a desired direct current load line. An output may be taken across tunnel diode device 5 at terminals 9–10.

In the embodiment shown in FIGS. 1 and 3 respectively a bias means including a voltage source is coupled to tunnel diode device 5 to establish a direct current load line therefor which, in combination with the impedance associated with the frequency determining element 1 and the mechanical energy stored therein, causes the tunnel diode device to produce oscillations having a repetition rate determined substantially by the natural mechanical frequency of the oscillating member 2. As described hereinbefore, the bias means may establish a direct current load line which intersects the tunnel diode current-voltage characteristic only in the negative resistance region, such as that shown at A in FIG. 2, or a direct current load line sucs as that shown by the examples B and C in FIG. 2. Preferably, the tunnel diode device is biased to establish a direct current load line such as that shown at A in FIG. 2, since this bias condition provides an electro-mechanical oscillator which is reliably self starting. A suitable biasing means, for example, may be as shown in FIG. 1 including voltage source 6 and series-parallel resistances 7 and 8. Alternatively, the bias means may be as shown in FIG. 3 including voltage source 6 and resistance 7 in series circuit relationship with the tunnel diode device 5 and utilizing the resistance 4 associated with winding 3 as a suitable shunt resistance thereacross. Other biasing circuit arrangements known to the art may be employed to establish a suitable direct current load line for purposes of this invention.

The electromechanical frequency determining element is of a type having an oscillating member having a natural mechanical frequency and an exciting winding therefor. For example, electromechanical frequency determining element 1 may be of the type in which the oscillating member is a vibrating reed which when tuned mechanically to a particular frequency may be caused to vibrate at that frequency by the field of an exciting winding energized from a source of alternating current of that frequency. Another example of such an electromechanical frequency determining element may be of the torsional pendulum type wherein an oscillating magnet member having a predetermined mechanical resonant frequency may be caused to oscillate at that frequency by the field of an exciting winding energized from an alternating current of an equal frequency. Other types of electromechanical frequency determining elements having an oscillating member and an exciting winding therefor may be similarly utilized in the practice of this invention.

For clarity and simplicity of explanation the following detailed description of the operation of the oscillator of this invention will be with particular reference to a tunnel diode device biased so as to establish a direct current load line which intersects the current-voltage characteristic only in the negative resistance region thereof such as that represented by the load line A in FIG. 2. Further, the description relates specifically to a frequency determining element of the torsional pendulum type, wherein the oscillating member 2 is a magnet member suitably supported by a torsion spring within the magnetic field of exciting winding 3. It is to be understood, however, that other suitable electromechanical frequency determining elements having an oscillating member and an exciting winding may be employed in the same manner and that direct current load lines such as illustrated at B and C in FIG. 2 operate in essentially the same manner as hereinafter described with respect to a direct current load line such as that illustrated at A in FIG. 2.

Assume initially, therefore, the tunnel diode device 5 is biased for average operation in the negative resistance known this point in the negative resistance region is unstable so as to cause the operating point to move out of this region and in to one of the regions of positive resistance. The current flowing through exciting winding 3 establishes a magnetic field around magnet member 2 causing a deflection thereof in well-known manner. This deflection of member 2 induces a voltage in winding 3 which is cooperation with the already unstable condition of tunnel diode 5 causes the operating point 11 to be moved out of the unstable negative resistance region and to a point such as shown at 12; the point 12 being determined by the circuit losses and the voltage induced in winding 3 by the movement of member 2.

At this point the mechanical energy stored in the torsion spring prevents further deflection of member 2 which then begins to deflect in the opposite direction under the urging of the torsion spring. This opposite deflection induces a voltage in winding 3 which is of opposite polarity thus producing an increase in voltage across tunnel diode device 5. When the voltage across tunnel diode 5 reaches a value exceeding that corresponding to the tunnel diode peak current, shown at D in FIG. 4, the operating point of the tunnel diode, due to the positive feed-back of the negative resistance, switches abruptly toward a higher voltage condition such as that shown, for example, by the point 13; the point 13 being determined by the net voltage across tunnel diode 5 produced by the voltage induced in winding 3. Again the torsion spring prevents further deflection of member 2 and deflection in the original direction begins again inducing a voltage in winding 3 of a polarity which results in a reduction in the voltage across tunnel diode 5 to a point where switching to a lower voltage condition results.

The natural mechanical frequency of the oscillating member 2, therefore, essentially determines the repetition rate of the oscillations produced by the tunnel diode device. For example, from the foregoing description it is evident that the switching of the tunnel diode from one voltage operating condition to the other is determined by the natural mechanical frequency of the oscillating member 2. Since there will be an appreciable deflection of oscillating member 2 only when the repetition rate of the oscillations is approximately equal to the natural mechanical frequency thereof, the output developed across the tunnel diode device is extremely stable and of a repetition rate substantially equal to the natural mechanical frequency of the oscillating member 2. The natural mechanical frequency thereof, the output developed across may be provided with extreme accuracy so that with all losses being supplied by the action of the tunnel diode device the resulting electromechanical oscillator produces an extremely stable output. The extreme stability and accuracy of the output across the tunnel diode device makes this oscillator particularly useful for a wide variety of applications such as, for example, accurate time bases, and in selective signaling systems.

While only certain preferred features of the present invention have been shown by way of illustration, many modifications and changes will occur to those skilled in the art. It is, therefore, to be understood that the appended claims are intended to cover all such modifications and changes as fall within the true spirit and scope of this invention.

What I claim as new and desire to secure by Letters Patent of the United States is:

1. An electromechanical oscillator comprising: a tunnel diode device exhibiting a negative resistance region in the low forward voltage range of its current-voltage characteristic; a frequency determining element including an oscillating member having a natural mechanical frequency and an exciting winding therefor; means coupling said tunnel diode device in circuit with the exciting winding of said frequency determining element; and means for rendering the oscillator self-starting including bias means coupled to said tunnel diode device for establishing a direct current load line therefor which intersects the current-voltage characteristic only in said negative resistance region.

2. An electromechanical oscillator comprising: a tunnel diode device exhibiting a negative resistance region in the low forward voltage range of its current-voltage characteristic; a frequency determining element including an oscillating member having a natural mechanical frequency and an exciting winding therefor; means coupling said tunnel diode device in circuit with the exciting winding of said frequency determining element; and means for rendering the oscillator self-starting including a voltage source coupled to said tunnel diode device establishing a direct current load line therefor which intersects the current-voltage characteristic only in the negative resistance region.

3. An electromechanical oscillator comprising: a tunnel diode device exhibiting a negative resistance region in the low forward voltage range of its current-voltage characteristic; a frequency determining element including an oscillating member having a natural mechanical frequency and an exciting winding therefor; means coupling said tunnel diode device in series circuit relationship with the exciting winding of said frequency determining element; and means for rendering the oscillator self-starting including bias means coupled to said tunnel idode device establishing a direct current load line therefor which intersects the current-voltage characteristic only in said negative resistance region.

4. An electromechanical oscillator comprising: a tunnel diode device exhibiting a negative resistance region in the low forward voltage range of its current-voltage characteristic; a frequency determining element including an oscillating member having a natural mechanical frequency and an exciting winding therefor; means coupling said tunnel diode device across said exciting winding; and means for rendering the oscillator self-starting including bias means coupled to said tunnel diode device to establish a direct current load line therefor which intersects the current-voltage characteristic only in said negative resistance region.

5. An electromechanical oscillator comprising: a tunnel diode device exhibiting a negative resistance region in the low forward voltage range of its current-voltage characteristic; an electromechanical torsional pendulum having a natural mechanical frequency including an oscillating magnet member and an exciting winding therefor; means coupling said exciting winding in circuit with said tunnel diode device; and means for rendering the oscillator self-starting including bias means coupled to said tunnel diode device establishing a direct current load line therefor which intersects the current-voltage characteristic only in said negative resistance region.

References Cited by the Examiner

UNITED STATES PATENTS

| | | | |
|---|---|---|---|
| 2,777,950 | 1/1957 | Doremus | 331—116 |
| 3,041,552 | 6/1962 | Adamthwaite, et al. | 331—107 |
| 3,054,070 | 9/1962 | Rutz | 331—107 |
| 3,095,529 | 6/1963 | Dome | 331—116 X |
| 3,127,574 | 3/1964 | Sommers | 331—107 |

ROY LAKE, *Primary Examiner.*